United States Patent
Nakamoto et al.

(10) Patent No.: US 10,020,233 B2
(45) Date of Patent: Jul. 10, 2018

(54) PLASMA PROCESSING APPARATUS AND PLASMA PROCESSING METHOD

(71) Applicant: Hitachi High-Technologies Corporation, Tokyo (JP)

(72) Inventors: Shigeru Nakamoto, Tokyo (JP); Tatehito Usui, Tokyo (JP); Satomi Inoue, Tokyo (JP); Kousa Hirota, Tokyo (JP); Kousuke Fukuchi, Tokyo (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 734 days.

(21) Appl. No.: 14/014,557

(22) Filed: Aug. 30, 2013

(65) Prior Publication Data
US 2014/0295583 A1 Oct. 2, 2014

(30) Foreign Application Priority Data

Mar. 29, 2013 (JP) ................................. 2013-070933

(51) Int. Cl.
*H01L 21/66* (2006.01)
*H01J 37/32* (2006.01)
*G01B 11/06* (2006.01)

(52) U.S. Cl.
CPC .......... *H01L 22/12* (2013.01); *G01B 11/0616* (2013.01); *G01B 11/0683* (2013.01); *H01J 37/32963* (2013.01); *H01J 37/32972* (2013.01); *H01L 22/26* (2013.01); *H01L 2924/0002* (2013.01)

(58) Field of Classification Search
CPC .......................... H01L 22/26; G01B 11/0616
See application file for complete search history.

(56) References Cited

U.S. PATENT DOCUMENTS 6,541,388 B1 4/2003 Saito
2003/0043383 A1* 3/2003 Usui .................. G01B 11/0675
356/504

(Continued)

FOREIGN PATENT DOCUMENTS

JP 2001085388 A 3/2001
JP 2003083720 A 3/2003

*Primary Examiner* — Moazzam Hossain
*Assistant Examiner* — Farun Lu
(74) *Attorney, Agent, or Firm* — Baker Botts L.L.P.

(57) ABSTRACT

In a plasma processing method and apparatus for processing a film to be processed contained in a film structure preliminarily formed on an upper surface of a wafer mounted in a processing chamber, by using plasma, a residual film thickness at an arbitrary time is calculated using a result of comparing detective differential waveform pattern data with actual differential waveform pattern data. The detective differential waveform pattern data is produced by using two basic differential waveform pattern data which respectively use, as parameters, residual thicknesses of the films to be processed in film structures having underlying films with different thicknesses and the wavelengths of the interference light. The detective waveform pattern data being preliminarily prepared prior to processing of the wafer. Determination is made as to whether or not an object of the processing has been reached by using the residual film thickness.

3 Claims, 5 Drawing Sheets

(56) References Cited

U.S. PATENT DOCUMENTS

2004/0262260 A1* 12/2004 Yang ................. H01J 37/32935
216/60
2007/0202613 A1* 8/2007 Usui .................. G01B 11/0625
438/14
2008/0216956 A1* 9/2008 Nakamoto ......... G01B 11/0625
156/345.25

* cited by examiner

PLASMA PROCESSING APPARATUS AND PLASMA PROCESSING METHOD

CROSS-REFERENCE TO RELATED APPLICATIONS

The present invention is related to U.S. Pat. No. 6,972,848 issued Dec. 6, 2005, the entire content of which is incorporated herein by reference for all purposes.

BACKGROUND OF THE INVENTION

The present invention relates to a plasma processing apparatus and a plasma processing method for detecting an end point of etching in etching processing of a substrate-like sample upon manufacturing of a semiconductor integrated circuit. In particular, the present invention relates to a plasma processing apparatus and a plasma processing method which execute the etching processing of a film structure containing a film to be processed, provided preliminarily on the upper or top surface of the substrate-like sample such as a semiconductor wafer mounted in a processing chamber inside a vacuum vessel, using plasma formed in the processing chamber while detecting a current processed condition.

In a step of manufacturing a semiconductor device from the substrate-like sample such as a semiconductor wafer, dry-etching technology has been widely used in which plasma formed in the processing chamber inside the vacuum vessel has been employed to form film layers of various materials on the surface of the wafer, particularly, for removal of film layers of dielectric material or formation of a pattern on the film. In such an etching processing apparatus using plasma, generally, processing gas introduced into the processing chamber which serves as a processing space within the vacuum vessel is reacted with electric field or magnetic field to produce plasma. Then, the film structure containing a film layer to be processed arranged preliminarily on the surface of a wafer is reacted with charged particles such as ions in the obtained plasma or high-active particles (radical) to etch the film to be processed.

In the wafer etching processing, it has been known that the intensity of light emitted by the formed plasma at a particular wavelength changes with a progress of etching of the film being processed. Then, according to a conventionally-known technology, a change in the intensity of emitted light at a particular wavelength from the plasma is detected during the processing, and an etching end point in which a film has been removed by etching or a predetermined depth has been reached by etching is detected based on a detection result.

Particularly, to achieve a higher integration of a semiconductor device and a higher miniaturization of its processing, it has been important to finish the processing in the etching process with the residual thickness of the film to be processed secured in a predetermined value. As a technology for finishing the etching processing with the thickness of the film to be processed in a predetermined value, there has been known a technology for detecting a residual film thickness using a change in the intensity of interference light, based on a knowledge that as the residual thickness of the film to be processed decreases with a progress of the etching processing, light emitted from the wafer surface containing the film to be processed forms an interference waveform.

For example, JP-A-2001-085788 (corresponding to U.S. Pat. No. 6,541,388) has disclosed a technology in which at least two kinds of wavelengths of the interference light are detected and then, the residual thickness of the film to be processed is detected by using the intensity of the interference light of those plural wavelengths.

In addition, JP-A-2003-083720 has disclosed a technology in which the interference light of plural wavelengths is detected and then, a pattern regarding the intensity of the interference light using each of preliminarily obtained plural wavelengths as a parameter is compared with data regarding the intensity of actually obtained interference light to detect the residual thickness of the film to be processed.

SUMMARY OF THE INVENTION

The above-described conventional technologies have problems because no sufficient care has been paid to following points.

For example, it has been known that reproducibility of the thickness of oxide film to be formed by low pressure chemical vapor deposition (LPCVD) is low and the reproducibility is said to be about 10%. On the other hand, even if the thickness of the film to be formed varies in such a manner in the etching process, the technologies disclosed in JP-A-2001-085388 and JP-A-2003-083720 are capable of detecting the residual film thickness of the film to be processed, precisely by detecting a change in the intensity of the interference light corresponding to an absolute value of the residual film thickness.

However, if the underlying film of a layer under the film to be processed is made of material capable of transmitting light and the thickness of the film varies largely depending on a sample, the intensity of the interference light obtained in each wafer is different even when the residual thickness of the film to be processed is equivalent. As a result, there has occurred such a problem that the residual thickness of the film to be processed cannot be detected accurately. The above-described conventional technologies have paid no attention to such a problem.

An object of the present invention is to provide a plasma processing apparatus and a plasma processing method for a semiconductor wafer and the like capable of detecting or adjusting the residual thickness of a film to be processed, accurately using plasma during an etching processing.

In order to attain the aforesaid object, there is provided with a plasma processing method for processing a film to be processed contained in a film structure preliminarily formed on an upper surface of a wafer mounted in a processing chamber inside a vacuum vessel, by using plasma formed in the processing chamber, the method including steps of:

detecting an intensity of interference light of plural wavelengths obtained from a surface of the wafer during the processing;

detecting time-series data of time-derivative based on the intensity of the interference light of plural wavelengths detected at an arbitrary time during the processing;

detecting actual differential waveform pattern data using the wavelengths as a parameter by using the time-series data regarding the plural wavelengths;

calculating a residual film thickness at the arbitrary time using a result of comparing detective differential waveform pattern data with the actual differential waveform pattern data, the detective differential waveform pattern data being produced by using two basic differential waveform pattern data which respectively use, as parameters, residual thicknesses of the films to be processed in film structures having underlying films with different thicknesses and the wavelengths of the interference light, the detective waveform pattern data being preliminarily prepared prior to processing of the wafer; and determining whether or not an object of the processing has been reached by using the residual film thickness thus calculated.

Other objects, features and advantages of the invention will become apparent from the following description of the embodiments of the invention taken in conjunction with the accompanying drawings.

DETAILED DESCRIPTION OF THE EMBODIMENTS

Hereinafter, embodiments of the present invention will be described with the accompanying drawings.

The embodiments of the present invention will be described with reference to FIGS. 1 to 5B.

Figure 1:
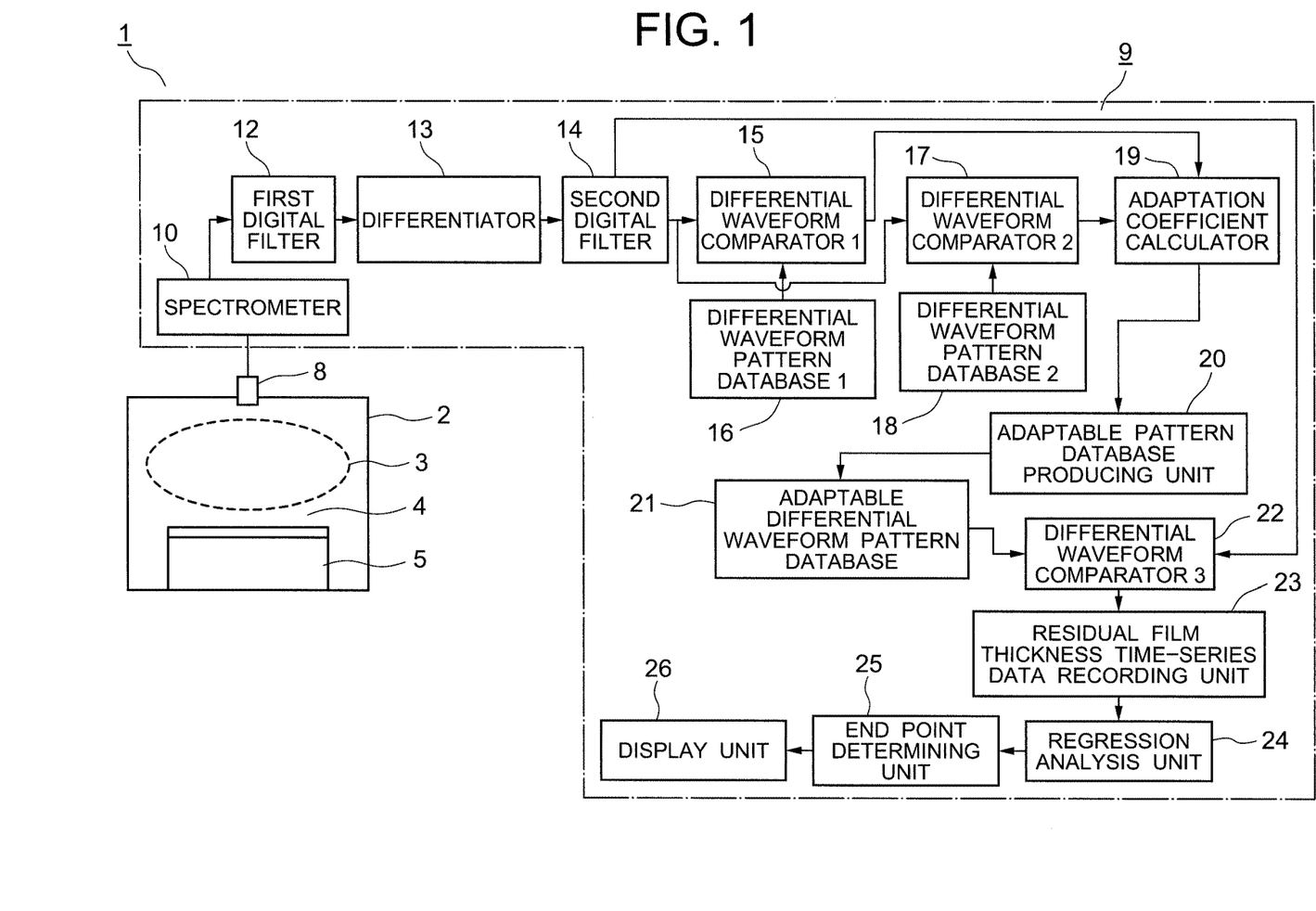
FIG. 1 is a schematic diagram showing a structure of the plasma processing apparatus according to an embodiment of the present invention.

FIG. 1 shows a plasma processing apparatus according to an embodiment of the present invention. FIG. 1 is a schematic diagram showing a structure of the plasma processing apparatus according to the embodiment of the present invention.

A plasma processing apparatus 1 includes a vacuum processing chamber 2 arranged within a vacuum vessel. The bottom of the vacuum vessel is connected to a ventilation unit having a vacuum pump, for example, a turbo-molecular pump (not shown). Above and around the vacuum vessel having a cylindrical shape, an electric field generating means, for example, a coaxial cable and an antenna supplied with high-frequency power (not shown) or a waveguide for propagating microwave or a magnetic field generating means is arranged to supply electric field or magnetic field to the inside of the vacuum processing chamber 2.

An external side wall of the vacuum vessel of the plasma processing apparatus 1 of the present embodiment is connected to another vacuum vessel (not shown) through a gate which is an opening. A wafer 4 as a sample is exchanged between one vacuum vessels 2 and another vacuum vessel 2 by being carried through a depressurized transfer chamber in the another vacuum chamber.

A sample stage 5 which has a cylindrical shape and on the top face of which a wafer 4 is to be mounted is arranged in the center of the bottom of the vacuum processing chamber 2. Furthermore, the vacuum vessel is connected to a supply pipe for supplying gas (not shown) and the gas supply pipe is connected to a plurality of gas introduction holes arranged in the top portion or ceiling face of the vacuum processing chamber 2.

The sample 4 is carried into the vacuum processing chamber 2 via a gate from the transfer chamber such that it is mounted on a front end portion of a transportation device such as a robot arm (not shown) and the sample 4 is transferred to the upper or top surface of the sample stage 5. After that, the robot arm is retracted from the vacuum processing chamber 2 and the gate is closed air-tightly by a gate valve so that the interior of the vacuum processing chamber 2 is sealed.

The wafer 4 is held on the top surface composed of dielectric material of the sample stage 5 serving as a wafer mounting surface such that it is attracted by static electricity. Heat transfer gas such as He is supplied to between the rear surface of the wafer 4 and the wafer mounting surface of the sample stage 5 to accelerate heat transfer between the wafer 4 and the sample stage 5.

Processing gas supplied via a gas supply pipe connected to a gas source is introduced into an inside space of the vacuum processing chamber 2 through the gas introduction hole and the inside space of the vacuum processing chamber 2 is exhausted by an operation of an exhaust unit. As a result, the inside space of the vacuum processing chamber 2 is depressurized up to a vacuum pressure suitable for processing of the substrate-like sample such as the semiconductor wafer by a balance between the gas supply rate and the air exhaust rate. With this condition, electric field or magnetic field is supplied into the inside space of the vacuum processing chamber 2 from the electric field or magnetic field generating means so that processing gas particles are excited to form plasma 3. Then, a film structure in which a plurality of films are layered preliminarily on the top surface of the wafer 4 mounted on the sample stage 5 is etched by charged particles or high-reactivity particles (active particles), contained in the plasma 3.

The excited particles contained in the plasma 3 emit boosted energy in the form of light beam so that the plasma 3 causes light emission. A light receiver 8 having a light transmission member for detecting the plasma 3 by receiving the light emission of the plasma is arranged on the top portion of the vacuum vessel, which corresponds to a ceiling portion of the vacuum processing chamber 2. Light emitted from the plasma 3 is received by the light receiver 8 directly or after the emitted light is reflected by the top surface of the wafer, and then, the received light is sent to an etching amount detecting apparatus 9 electrically or optically linked or connected with the light receiver 8 in the form of a signal.

Figure 2A:
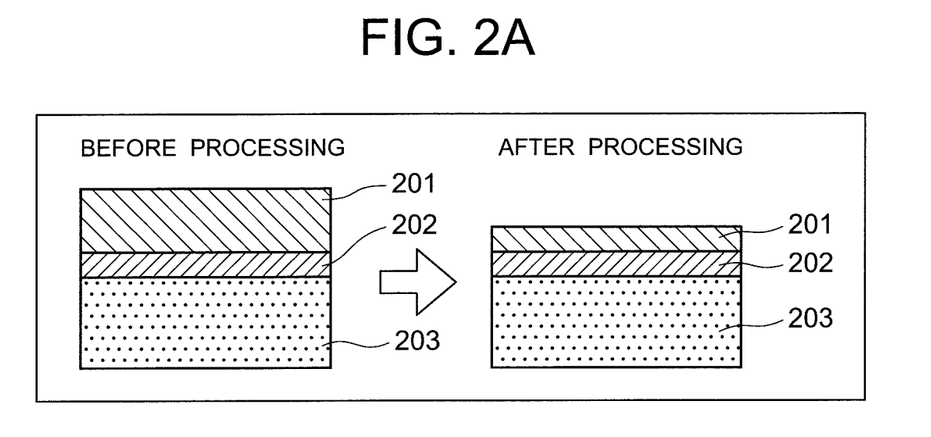
FIGS. 2A to 2C are schematic diagrams showing film layer structures on a wafer to be etched by the plasma processing apparatus.
Figure 2B:
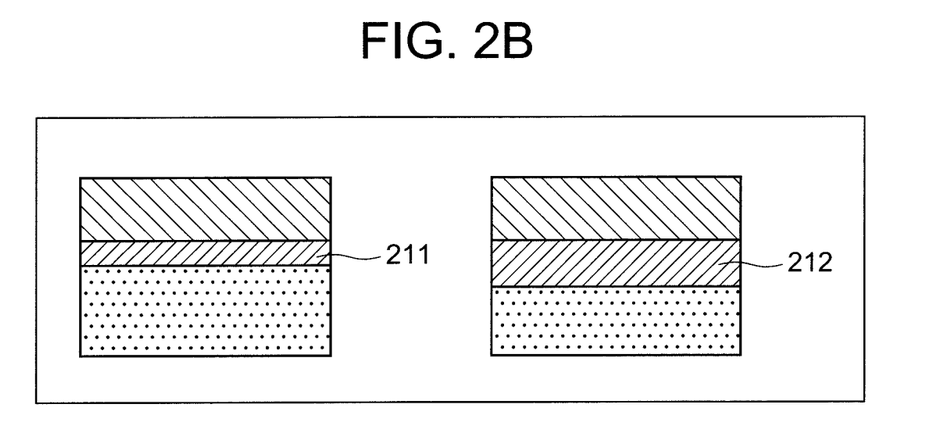
Figure 2C:
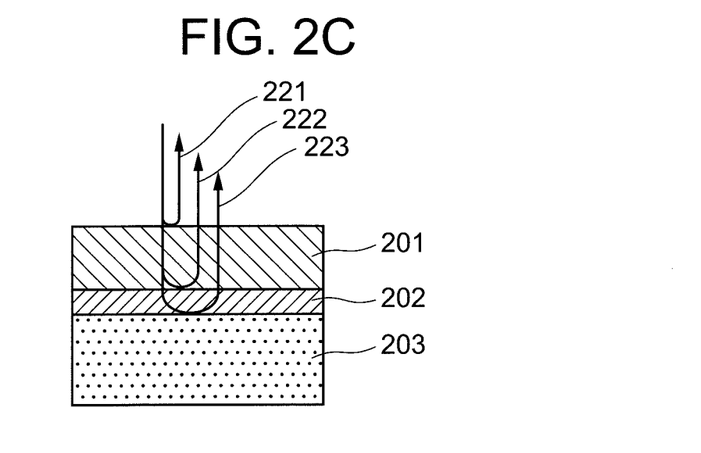

A typical example of the film structure to be etched according to the present embodiment will be described with reference to FIGS. 2A-2C. FIGS. 2A-2C are schematic diagrams showing the film structure on a wafer to be etched by the plasma processing apparatus shown in FIG. 1.

As shown in FIG. 2A, the film structure to be processed of the present embodiment includes a polysilicon film 201 which is a film to be processed, an oxide film 202 which is a film layer disposed under the polysilicon film 202 in contact therewith as an underlying film, and a silicon substrate 203. Light beam from the plasma impinging on the film structure having such a structure is reflected by a boundary or an interface between the respective films so as to generate reflected light. The reflected light includes reflected light 221 which is generated by being reflected by the surface of the polysilicon film 201, reflected light 222 which is generated by being reflected by a boundary between the polysilicon film 201 and the oxide film 202, and reflected light 223 which is generated by being reflected by a boundary between the oxide film 202 and the silicon substrate 203.

Because there are differences in light path lengths among these reflected lights, interference light is produced. Further, because, with progress of etching, the film thickness of the polysilicon film 201 which is a film to be processed is reduced, the differences in light paths change among the reflected lights, so that interference phenomenon occurs in which the cycle of change in light intensity varies depending on the wavelengths of the reflected lights. The interference light whose intensity changes is transmitted to a spectrometer 10 in the etching amount detecting apparatus 9 via the light receiver 8 which faces the plasma 3 at the top portion of the vacuum processing chamber 2 in FIG. 1. The etching amount detecting apparatus 9 detects the intensity of the interference light and a change amount of the interference light from signals concerning the transmitted interference light. Then, the etching amount detecting apparatus 9 determines, based on the detection result, an etching amount, that is, an etching depth and residual film thickness of the polysilicon film 201 and whether or not an end point of processing has been reached.

As shown in FIG. 1, the etching amount detecting apparatus 9 of the present embodiment includes: a spectrometer 10, a first digital filter 12, a differentiator 13, a second digital filter 14, a differential waveform comparator 1 15, a differential waveform pattern comparator 1 16, a differential waveform comparator 2 17, a differential waveform pattern database 2 18, an adaptation coefficient calculator 19 for obtaining a ratio based on a result of these differential waveform comparators, an adaptable pattern database producing unit 20 for producing an adaptable pattern database using an adaptation coefficient calculated by the adaptation coefficient calculator 19, an adaptable pattern database 21, a differential waveform comparator 3 22, a residual film thickness time-series data recording unit 23 which calculates a residual film thickness of a film to be processed based on an output from the differential waveform comparator 3 22 and records its result in a time-series manner, a regression analysis unit 24 for calculating a current residual film thickness using the residual film thickness time-series data recorded in the residual film thickness time-series data recording unit 23, an end point determining unit 25 which determines an end of etching from a current residual film thickness and a display unit 26 which displays a determination result of the end point determining unit 25.

The etching amount detecting apparatus of the present embodiment may be so constructed that the plural detecting units each containing a semiconductor device such as a microprocessor which exerts each of their functions except the display unit 26, are connected to each other by means of a wired or wireless communication line or may be constructed of a single semiconductor device capable of exerting these plural functions. The detecting unit containing the semiconductor device includes an arithmetic operating device such as a microprocessor, a communication interface which communicates signals with outside, and a storage device such as an RAM, an ROM, a hard disk drive, a CD-ROM for recording data or software so that they are connected communicably with each other.

Light beam of the plasma 3 formed in the vacuum processing chamber 2 is reflected by the top surface of the wafer 4 and transmitted to the spectrometer 10 via the light receiver 8. A signal of the interference light is dispersed or split to light rays having respective predetermined frequencies and the intensity of each of the wavelength is converted into a digital signal and outputted.

A plurality of signals of each particular wavelength output as a sample signal at an arbitrary time during processing of the wafer 4 by the spectrometer 10 is stored in a storage device such as RAM (not shown) as time-series data yij. This time-series yij is transmitted to the first digital filter 12, smoothed and stored in the storage device such as RAM as smoothed time-series data Yij.

Next, the smoothed time-series data Yij is transmitted to the differentiator 13 and time-series data dij of a time-derivative (differential coefficient) value (first differential value or second differential value) thereof is calculated and its result is stored in a storage device such as a RAM. The time-series data dij of the differential coefficient is smoothed by the second digital filter 14 and its result is stored in the storage device such as a RAM as smoothed differential coefficient time-series data Dij. Then, from this smoothed differential coefficient time-series data Dij, a differential waveform pattern (actual pattern) is obtained which indicates a wavelength dependency of the differential value of the intensity of interference light (with the wavelength as a parameter).

Here, the calculation of the smoothed differential value time-series data Di will be described. In the present embodiment, for example, a second order Butterworth type low-pass filter is used as the digital filter circuit 12. Smoothed time-series data Yi which is to be smoothed by the second order Butterworth type low-pass filter is obtained according to Equation 1.

$$Yi = b1 \cdot yi + b2 \cdot yi-1 + b3 \cdot yi-2 - [a2 \cdot Yi-1 + a3 \cdot Yi-2] \quad (1)$$

Where the coefficients b, a are different depending on a sampling frequency and a cut-off frequency. In the present embodiment, as the coefficient value of the digital filter, for example, a2=−1.143, a3=0.4128, b1=0.067455, b2=−0.013491, b3=0.067455 (sampling frequency: 10 Hz, cut-off frequency: 1 Hz) are used. Time-series data di of the second differential coefficient value is calculated by means of the differentiator 13 according to Equation 2 using polynomial fitting smoothing differential method for five time-series data Yi.

$$di = \sum_{j=-2}^{j=2} wj \cdot Yi + j \quad (2)$$

Where as regards weight coefficient w, w−2=2, w−1=−1, w0=−2, w1=−1, w2=2
The smoothed differential coefficient time-series data Di is calculated by the digital filter circuit 14 using the time-series data di of the aforementioned differential coefficient values by means of, for example, the second order Butterworth type low-pass filter based on Equation (3), as follows.

$$Di = b1 \cdot di + b2 \cdot di-1 + b3 \cdot di-2 - [a2 \cdot Di-1 + a3 \cdot Di-2] \quad (3)$$

Differential waveform pattern data value P1sj regarding the intensity of interference light with respect to the amount (residual film amount) of residual film thickness of polysilicon which is a film to be processed and whose etching amount is to be measured, the polysilicon being disposed on top of the underlying oxide film having a predetermined thickness is preliminarily stored in the differential waveform pattern database 16 prior to processing of the wafer 4. In the differential waveform comparator 1 15, an actual pattern which is a differential waveform data regarding the interference light obtained during processing of the wafer 4 is compared with the differential waveform pattern data value P1sj stored in the differential waveform pattern database 1 16 and then, a value of difference between the both patterns is calculated.

Likewise, in the differential waveform pattern database 2 18 is preliminarily set a differential waveform pattern data value P2sj regarding the interference intensity with respect to the residual film amount of polysilicon which is the film to be processed and whose etching amount is to be measured, arranged on top of the underlying oxide film having a predetermined thickness different from the differential waveform pattern database 1 16. In the differential waveform comparator 2 17, the actual pattern which is differential waveform data regarding the interference light actually obtained during processing of the wafer 4 and the differential waveform pattern data value P2sj stored in the differential waveform pattern database 2 18 are compared with each other to calculate a value of difference between the both patterns. According to the present embodiment, as the differential waveform data which are stored in the differential waveform pattern database 1 16 and the differential waveform pattern database 2 18 and are registered for use in detecting the thickness of the residual film, there are employed differential waveform pattern data regarding the interference light intensity with respect to the amount of the residual film thickness (residual film amount) being currently etching-processed of polysilicon arranged on the oxide film 202 having an upper limit and a lower limit in terms of film thickness or a film thickness near these values, respectively, wherein the oxide film is an underlying film whose thickness varies within an arbitrary range.

On the other hand, FIG. 2B shows sections of wafers having oxide films 211, 212 as the underlying film, which are different in film thickness. It has been known that the oxide film formed by low pressure chemical vapor deposition (LPCVD) has a low reproducibility in film thickness, and its reproducibility is said to be about 10%.

When the oxide films 211, 212 which are the underlying films are different in thickness between the film layer structures, a problem occurs. Even if the residual film amount of polysilicon to be processed is the same between the film layer structures, if the thicknesses of the oxide films 211, 212 are different therebetween, as shown in FIG. 2C, light path length differences of light 223 reflected by the boundary between the oxide film as the underlying film and the substrate from other reflected lights 221, 222 become also different between these film layer structures. As regards the interference of the lights, maximum and minimum values of the intensity of the interference light are determined depending on the light path length difference in the film layer structure, so that the intensity of the interference light differs between these film layer structures even if the thickness of the polysilicon film 201 is the same. As a consequence, it becomes difficult to detect the film thickness precisely based on the intensity of the interference light.

Figure 3:
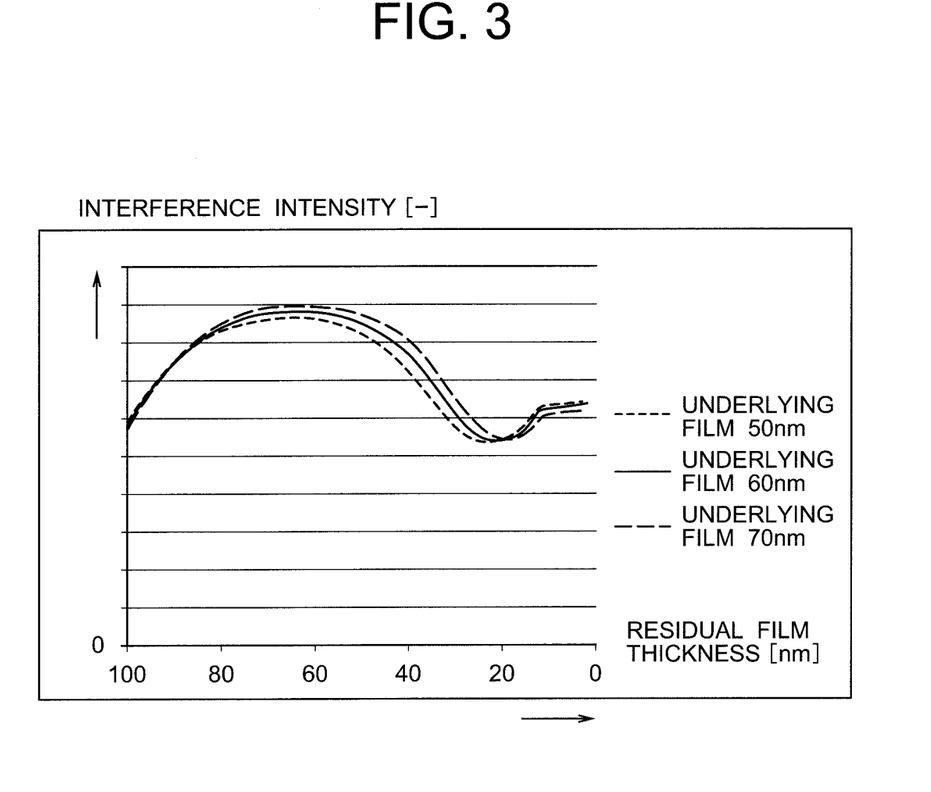
FIG. 3 is a graph showing a relation between the intensity of interference light and the thickness of an underlying film in the film structure shown in FIG. 2.

FIG. 3 shows changes of the interference intensity with respect to the residual film thickness of polysilicon in a case where the wavelength of light is 700 nm, the film to be processed is polysilicon and the film thickness of the oxide film as an underlying film is 50 nm, 60 nm and 70 nm. FIG. 3 is a graph showing a relationship between the intensity of the interference light of the film structure shown in FIG. 2 and the thickness of the underlying film.

As shown in FIG. 3, if the film thickness of the underlying oxide film is different, the change of the intensity of the interference light is also different. When the intensity of the interference light is at a minimum value, in a wafer in which the film thickness value of the underlying oxide film thereof is different, the residual film thickness of the polysilicon film is also different. This means that in an apparatus for determining the residual film thickness using the interference light, the determination accuracy deteriorates depending on the film thickness value of the underlying oxide film.

In the present embodiment, differential waveform databases regarding etching processing of film structures whose underlying oxide films 202 have different thicknesses are stored in the differential waveform pattern database 1 16 and the differential waveform pattern database 2 18, respectively, and data stored in these databases is combined as basic database to produce a new pattern data or a new database thereof. Using the new pattern data or new database for detecting the film thickness, even if the film thickness of the underlying oxide film 202 varies, the film thickness of the polysilicon film 201 on the top of the oxide film or an end point of etching depth can be determined accurately. Although two differential waveform pattern databases are indicated in FIG. 1, the number of the differential waveform pattern databases may be more than two.

Hereinafter, a configuration for calculating the differential waveform for use for detecting a film thickness by combining the pattern data stored in the differential waveform databases as the basic data depending on each of the oxide films 211, 212 having different film thicknesses according to the present embodiment will be described. The differential waveform comparator 1 15 obtains a minimum residual error σs1(t) between a pattern of the differential waveform data stored in the differential waveform database 1 16 and an actual pattern of the differential waveform data obtained during processing of the wafer 4 for use in producing the semiconductor device. Similarly, the differential waveform comparator 2 18 obtains a minimum residual error σs2(t) between a pattern of the differential waveform data stored in the differential waveform database 2 18 and an actual pattern of the differential waveform data obtained during processing of the wafer 4 for use in producing the semiconductor device. The residual error of this embodiment uses a magnitude of square error of each time-series data value as described below.

After receiving the minimum residual errors σs1(t) and σs2(t), the adaptation coefficient calculator 19 calculates and outputs a ratio between the two minimum residual errors, i.e., an adaptation coefficient α(t) using the following equation (4).

$$\alpha(t)=\sigma s2(t)/(\sigma s1(t)+\sigma s2(t)) \quad (4)$$

The adaptable pattern database producing unit 20 produces an adaptable differential waveform pattern database 21 using a value of the received adaptation coefficient α(t) and the differential waveform pattern data values P1sj and P2sj, according to a following equation (5) and outputs the result to and stores it in a storage device.

$$NDBsj=\alpha(t) \cdot P1sj+(1-\alpha(t)) \cdot P2sj \quad (5)$$

Next, the differential waveform comparator 3 22 compares the adaptable differential waveform pattern database 21 with the actual pattern to obtain a residual film thickness (instantaneous film thickness) of the polysilicon film at an arbitrary time and stores it in the residual film thickness time-series data recording unit 23. The regression analysis unit 24 calculates a current residual film thickness (calculation film thickness) by means of regressive arithmetic operation using residual film thicknesses (instantaneous film thicknesses) at a current time (arbitrary time) and at a plurality of previous times, stored in the residual film thickness time-series data recording unit 23.

A resulting residual film thickness calculated by the regression arithmetic operation is transmitted to the end point determining unit 25, and then, the end point determining unit 25 compares a preliminarily set target residual thickness with a current film thickness (calculated) and determines whether the current residual film thickness (calculated) is lower than the target residual film thickness. If the current residual film thickness is determined to be lower than the target value, it is determined that the etching amount of the film to be processed has reached a predetermined value (has reached the end point), and an instruction of terminating the etching processing is sent to the plasma processing apparatus 1. Further, the determination result is transmitted to the display unit 26, so that the determination result is displayed on the display unit 26 having liquid crystal or CRT to notify a user. The display unit 26 is notified of an operating condition of the plasma processing apparatus 1, an abnormality during an operation and operating error information.

Figure 4:
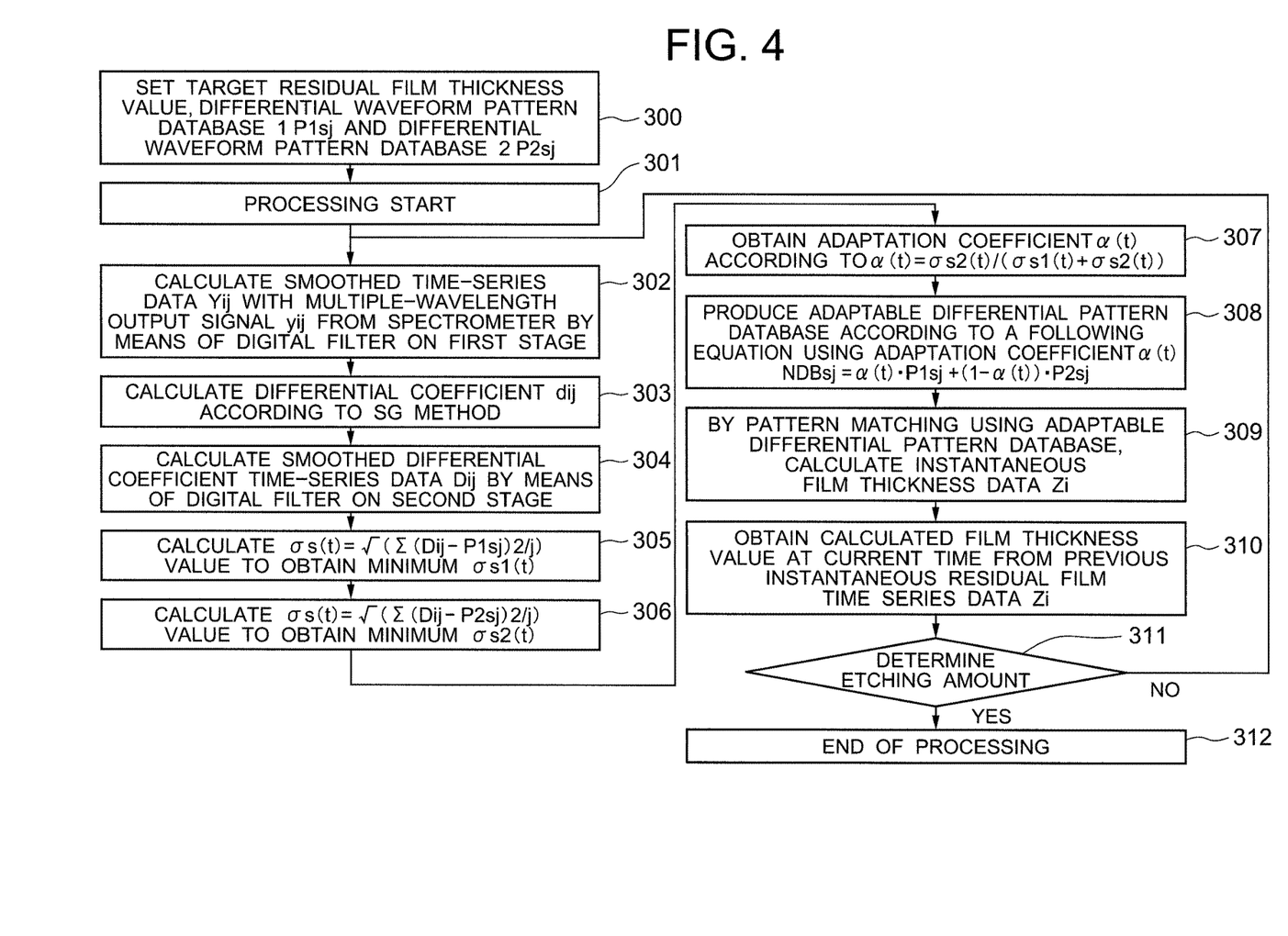
FIG. 4 is a flowchart showing a flow of operations for detecting an etching amount of the plasma processing apparatus according to the embodiment shown in FIG. 1.

Next, steps for obtaining the etching amount of the film to be processed when executing the etching processing using the etching amount detecting apparatus 9 of FIG. 1 will be described based on a flowchart of FIG. 4. FIG. 4 is a flowchart showing a flow of operations for detecting an etching amount of the plasma processing apparatus 1 according to the embodiment shown in FIG. 1. This flowchart shows mainly a flow of operations of the etching amount detecting apparatus 9.

In the present embodiment, prior to the processing of the wafer 4, a target value of the residual film thickness of the polysilicon film 201 which is a film to be processed and also pattern data stored in the differential waveform pattern database 1 16 and the differential waveform pattern database 2 18 used for detection and determination of the target value are set up (step 300). As the pattern data to be selected from these two differential waveform pattern databases, data relating to the underlying oxide films 202 respectively having different film thicknesses are selected and set up.

Although the present embodiment employs two differential waveform pattern databases for use for comparison, more than two database may be used. If three or more differential waveform pattern databases are used, it is permissible to select two databases having primary and secondary minimum residual errors σsi(t) to obtain an adaptation coefficient α(t) according to the Equation (4).

Next, sampling of the interference light which is obtained by starting the processing of the wafer 4 in the vacuum processing chamber 2 (for example, every 0.1 to 0.5 seconds) is started (step 301). At this time, accompanied by starting of the etching processing, a sampling start instruction is output. The emission intensity of light of plural wavelengths which changes with a progress of the etching processing is transmitted to the spectrometer 10 of the etching amount detecting unit 9. The light detector detects the emission intensity as a light detection signal having a voltage corresponding to the light intensity of every predetermined frequency and outputs the light detection signal.

The light detection signal of the spectrometer 10 is converted to digital signals and a sampling signal yij is obtained as data signal corresponding to an arbitrary time. Next, a multiple-wavelength output signal yij from the spectrometer 10 is smoothed by the digital filter circuit 12 on a first stage and consequently, time-series data Yij of an arbitrary time is calculated (step 302).

Next, the time-series data Yij is transmitted to the differentiator 13 and a time-series differential coefficient dij is calculated according to Savitzky-Golay (S-G) method (step 303). That is, a signal wavelength coefficient (primary or secondary) di is detected by the differential processing (based on the S-G method).

The differential coefficient dij is transmitted to the digital filter circuit 14 on a second stage to calculate a smoothed differential coefficient time-series data Dij (step 304). The obtained smoothed differential coefficient time-series data Dij is transmitted to the differential waveform comparator 1 15 and the differential waveform comparator 2 17.

In the differential waveform comparator 1 15, $\sigma s(t)=\sqrt{(\Sigma(Dij-P1sj)2/j)}$ value is calculated to obtain minimum $\sigma s1(t)$ (step 305). Likewise, in the differential waveform comparator 2 17, $\sigma s(t)=\sqrt{(\Sigma(Dij-P2sj)2/j)}$ value is calculated to obtain minimum $\sigma s2(t)$ (step 306). Steps 305, 307 may be executed in parallel. The obtained $\sigma s1(t)$ and $\sigma s2(t)$ are transmitted to the adaptation coefficient calculator 19, in which an adaptation coefficient $\alpha(t)=\sigma s2(t)/(\sigma s1(t)+\sigma s2(t))$ is calculated (step 307).

The obtained adaptation coefficient $\alpha(t)$ is transmitted to the adaptable pattern database producing unit 20, in which the adaptable differential waveform pattern database 21 is produced using differential waveform data pattern values set in the differential waveform pattern database 1 16 and differential waveform data pattern values set in the differential waveform pattern database 2 18 according to Equation (5) and stored in the storage device (step 308). The differential waveform comparator 3 22 executes pattern-matching processing between data values of the adaptable differential waveform pattern database 21 produced in step 308 and data of the actual pattern which is a differential waveform pattern obtained from the smoothed differential coefficient time-series data Dij produced in step 304, and then, a residual film thickness corresponding to the data in the adaptable differential waveform pattern database 21 which presents a minimum residual error as the most adaptable pattern data is calculated as instantaneous film thickness data Zi at an arbitrary time (current time) (step 309).

In step 309, a current calculation film thickness value is calculated by means of the regression analysis unit 24 using instantaneous film thickness time-series data Zi recorded in the residual film thickness time-series data recording unit 23 and instantaneous film thickness time-series data Zi at plurality of times in the past being currently processed (step 310). That is, by arithmetic operation of the regression analysis unit 24, a primary regression line Y=Xa·t+Xb (Y: residual film amount, t: etching time interval, Xa: absolute value of Xa is etching rate, Xb: initial film thickness) is obtained, and from this regression line, etching amount (or residual film thickness) at a current time is calculated and stored in the storage device (step 310).

If the minimum residual error of the actual pattern with respect to the adaptable differential waveform pattern data is larger than a predetermined threshold as a result of comparison in step 309, it is permissible to skip storing of a film thickness corresponding to the adaptable differential waveform pattern data which presents the minimum residual error as instantaneous film thickness data Zi at a current time. Alternatively, it is permissible to execute arithmetic operation with the regression analysis unit 24 at step 310 with the instantaneous film thickness data Zi at a processing time in the past (e.g., sampling time just before a current time) or a film thickness data obtained by the regression arithmetic operation as an instantaneous film thickness Zi at a current time.

A residual film thickness of the current film to be processed is compared with a preliminarily set target residual film thickness value (set in step 300). If it is determined that the residual film thickness is smaller than the target residual film thickness value, it is determined that the target value has been reached, and a signal for terminating the etching processing is sent to the plasma processing apparatus 1. If it is determined that the target value has not been reached, the procedure returns to a processing of step 302 (step 311). An etching amount such as etching depth is determined (step 311) and if it is determined that the etching amount is sufficient, setting of sampling termination is executed as a final stage (step 312).

If it is determined that the target value has been reached in step 311, not only a control for terminating the etching processing is carried out but also an instruction for executing a next etching processing may be dispatched to the plasma processing apparatus 1. For example, an over-etching processing with a lowered processing speed may be carried out. Alternatively, if the film to be etched is composed of a plurality of film layers, the operating condition of the plasma processing apparatus 1 may be changed to an operation condition suitable for lower film layers before executing this etching processing.

Figure 5A:
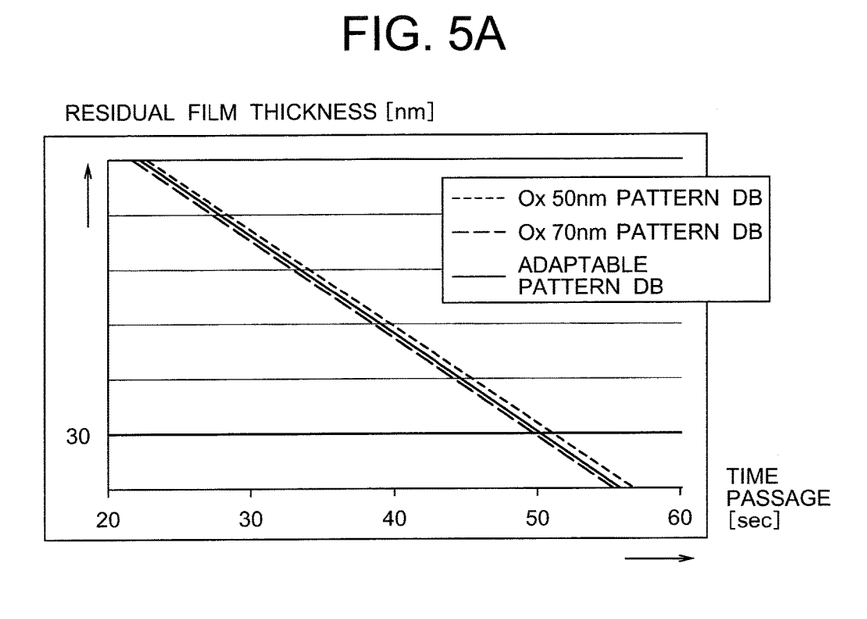
FIGS. 5A and 5B are graphs showing an effect of the wafer etched in the embodiment shown in FIG. 1.
Figure 5B:
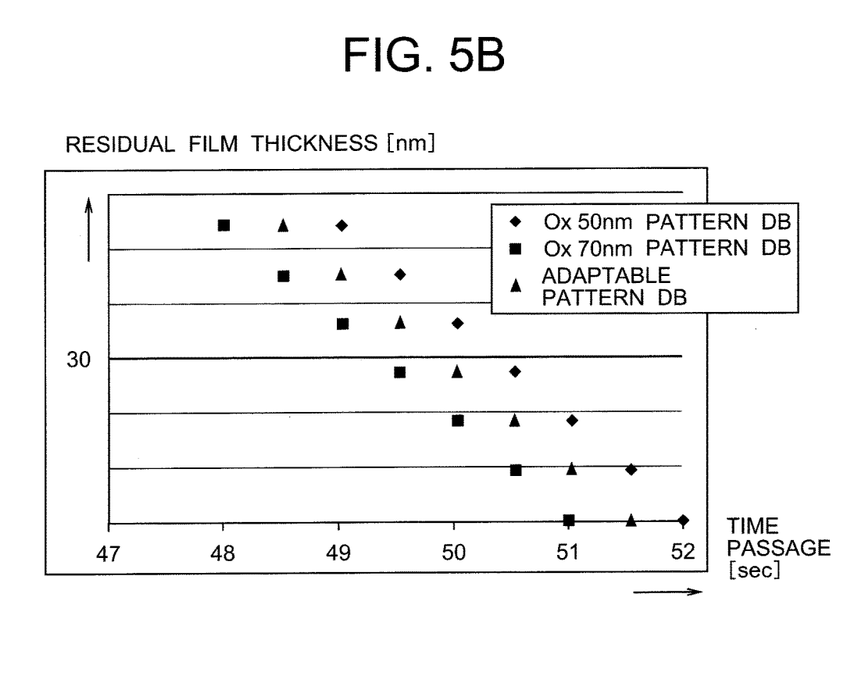

FIGS. 5A, 5B show advantageous effects of the present embodiment. FIGS. 5A, 5B are graphs showing advantageous effects of the etching processing on a wafer according to the embodiment shown in FIG. 1.

This Figure shows a result after etching a wafer whose underlying oxide film is 60 nm in thickness. In FIGS. 5A, 5B, O×50 nm indicates a result of matching processing with only the differential waveform pattern database whose underlying oxide film is 50 nm in thickness, and O×70 nm indicates a result of matching processing with the differential waveform pattern database whose underlying oxide film is 70 nm in thickness. The adaptable pattern database (DB) indicates a result based on the present invention, which is a result of a pattern matching by setting database whose underlying oxide film is 50 nm and database whose underlying oxide film is 70 nm in the differential waveform pattern database 1 16 and the differential waveform pattern database 2 18 respectively.

FIG. 5B is a diagram showing in an enlarged manner a part of FIG. 5A, that is, an area where the residual film thickness of a film to be processed is around 30 nm. As a result of a matching processing with the differential waveform pattern database whose underlying oxide film is 70 nm in thickness as indicated by the O×70 nm pattern DB in FIG. 5B, it is detected that the residual film thickness of polysilicon has lowered bellow 30 nm at 49.5 seconds.

As a result of a matching processing with the differential waveform pattern database whose underlying oxide film is 50 nm in thickness as indicated by the O×50 nm pattern DB in FIG. 5B, it is detected that the residual film thickness of polysilicon has lowered below 30 nm at 50.5 seconds. According to a result of a processing based on an algorithm of the present invention in which database whose underlying oxide film is 50 nm and database whose underlying oxide film is 70 nm are set as the differential waveform pattern database 1 and the differential waveform pattern database 2, respectively, as indicated by the adaptable pattern DB, it is detected that the residual film thickness of polysilicon has lowered below 30 nm at 50.0 seconds.

In FIG. 5B, the adaptable pattern DB is situated in the middle between the O×50 nm pattern DB and the O×70 nm pattern DB, indicating changes in film thickness in a case where the thickness of the underlying oxide film is 60 nm. A result of the underlying oxide film having a thickness of 50 nm indicates that the polysilicon residual film thickness of 30 nm has been reached the latest of all. This is correlated with a fact that the minimum value of the interference intensity is dependent of the film thickness of the underlying oxide film and that as the thickness of the underlying oxide film has decreased to 70 nm, 60 nm, and 50 nm, the residual film amount of polysilicon residual film amount has increased.

As described above, the present embodiment allows information about the thickness of the underlying oxide film to be used for production control regarding the thickness of the underlying oxide film.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A plasma processing method using an etching amount detecting unit for processing a film to be processed comprising a layers structure preliminarily arranged on an upper surface of a wafer mounted in a processing chamber inside a vacuum vessel, by using plasma generated in the processing chamber, wherein the layers structure comprises the film to be processed and an underlying film which comprises $SiO_2$ as a material, the method comprising steps of:
   detecting an intensity of interference light of plural wavelengths obtained from a surface of the wafer during the processing;
   detecting time-series data of time-derivative based on the intensity of the interference light of plural wavelengths detected at an arbitrary time during the processing;
   detecting actual differential waveform pattern data using wavelengths as a parameter by using the time series data regarding the plural wavelengths;
   calculating a residual film thickness at the arbitrary time using a result of comparing detective differential waveform pattern data with the actual differential waveform pattern data, wherein the detective differential waveform pattern data is produced using two basic differential waveform pattern data of the intensity of the interference light using wavelengths of the interference light as parameters, each of the two basic differential waveform pattern data being indicative of residual thicknesses of the films to be processed that are contained in each of two separate layers of the layers structure, wherein the underlying film thicknesses of each of the two separate layers are different, the detective differential waveform pattern data being preliminarily prepared prior to the processing of the wafer, and wherein the two basic differential waveform pattern data are interpolated by using a ratio of minimum differences between each of the two basic differential waveform pattern data and the actual differential waveform pattern data to thereby produce detective differential waveform pattern data; and
   determining by the etching amount detecting unit whether or not an endpoint of the processing has been reached by using the residual film thickness thus calculated and terminating the processing if the endpoint has been reached.

2. The plasma processing method according to claim 1, wherein
   at each of a plurality of times during the processing, the detective differential waveform pattern data is produced using the two basic differential waveform pattern data; and the residual thickness at the each time is calculated using a result of comparing the detective differential waveform pattern data with the actual differential waveform pattern data at the each time.

3. The plasma processing method according to claim 1, wherein at the arbitrary time, the detective differential waveform pattern data and the actual differential waveform pattern data are compared with each other and a residual thickness which is corresponding to a differential waveform pattern at which a difference as a result of comparison therebetween becomes minimum is stored as a residual film thickness at the arbitrary time, by using the residual film thickness at the arbitrary time and the residual film thickness at a time prior to the arbitrary time, a residual thickness at the arbitrary time is calculated again, and determination is made as to whether the target of the processing has been reached by using the residual film thickness calculated again.

\* \* \* \* \*